(12) United States Patent
Lee et al.

(10) Patent No.: US 8,120,442 B2
(45) Date of Patent: Feb. 21, 2012

(54) SEMICONDUCTOR DEVICE

(75) Inventors: Ji-Wang Lee, Gyeonggi-do (KR);
Kun-Woo Park, Gyeonggi-do (KR);
Yong-Ju Kim, Gyeonggi-do (KR);
Hee-Woong Song, Gyeonggi-do (KR);
Ic-Su Oh, Gyeonggi-do (KR);
Hyung-Soo Kim, Gyeonggi-do (KR);
Tae-Jin Hwang, Gyeonggi-do (KR);
Hae-Rang Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 518 days.

(21) Appl. No.: 12/266,787

(22) Filed: Nov. 7, 2008

(65) Prior Publication Data
US 2009/0302965 A1    Dec. 10, 2009

(30) Foreign Application Priority Data

Jun. 4, 2008  (KR) .................. 10-2008-0052753

(51) Int. Cl.
*H04B 3/04* (2006.01)
(52) U.S. Cl. .......................... 333/18; 327/261
(58) Field of Classification Search .......... 333/2, 1, 333/12, 18, 138, 139, 140, 156; 327/261, 327/262, 263, 264, 161; 713/400, 401
See application file for complete search history.

(56) References Cited

U.S. PATENT DOCUMENTS

| | | | | |
|---|---|---|---|---|
| 4,894,626 A * | 1/1990 | Kubinec | ................... | 333/101 |
| 5,594,762 A * | 1/1997 | Joo et al. | ................... | 375/371 |
| 5,949,269 A * | 9/1999 | Allen | ................... | 327/285 |
| 6,614,278 B2 * | 9/2003 | Kim et al. | ................... | 327/263 |
| 6,854,030 B2 | 2/2005 | Perino et al. | | |
| 6,861,886 B1 * | 3/2005 | Ludden et al. | ................... | 327/156 |
| 6,924,685 B2 * | 8/2005 | Bae | ................... | 327/276 |
| 6,998,892 B1 * | 2/2006 | Nguyen et al. | ................... | 327/161 |
| 7,020,792 B2 * | 3/2006 | Hall | ................... | 713/401 |
| 7,052,967 B2 | 5/2006 | Lee et al. | | |
| 7,137,022 B2 * | 11/2006 | Ishikawa | ................... | 713/400 |
| 7,236,033 B2 * | 6/2007 | Yeh et al. | ................... | 327/261 |

FOREIGN PATENT DOCUMENTS

| | | |
|---|---|---|
| JP | 2000-029925 | 1/2000 |
| JP | 2005-197637 | 7/2005 |
| KR | 1020000046659 | 7/2000 |
| KR | 1020040014237 | 2/2004 |

OTHER PUBLICATIONS

Notice of Allowance issued from Korean Intellectual Property Office on Feb. 20, 2011.

\* cited by examiner

*Primary Examiner* — Robert Pascal
*Assistant Examiner* — Alan Wong
(74) *Attorney, Agent, or Firm* — IP & T Group LLP (57) ABSTRACT

A semiconductor device includes transmission lines for conveying signals and transition detectors, each of which checks whether a transmission signal on each of the plurality of transmission lines is transited. If the signal is transited, its transition shape is detected. A signal mode determining unit determines signal transmission modes between adjacent transmission lines in response to output signals from the plurality of transition detectors. Delay units are coupled to the respective transmission lines for adjusting transmission delays of the transmission signals depending on corresponding output signal from the signal mode determining units.

8 Claims, 9 Drawing Sheets

SEMICONDUCTOR DEVICE

CROSS-REFERENCE TO RELATED APPLICATION

The present invention claims priority from Korean patent application number 10-2008-0052753, filed on Jun. 4, 2008, which is incorporated by reference in its entirety.

BACKGROUND OF THE INVENTION

The present invention relates to a semiconductor design technology; and more particularly, to a technology of removing crosstalk that may occur between transmission lines of the semiconductor device.

In semiconductor devices, when a signal is transmitted via a transmission line, the signal may be affected by electromagnetic fields, which will be discussed in detail below.

When a dielectric is between metals, there is capacitance between them. In general, a transmission line is made of metal and a dielectric is arranged between transmission lines, and thus, capacitance may exist between them. It is known that even air is a dielectric whose relative dielectric constant is '1'. Therefore, even when transmission lines are arranged in the air, there may also be capacitance between them. When an alternate current of high frequency band flows onto a transmission line, electrical energy interference occurs due to the influence of capacitance between transmission lines, i.e., mutual capacitance, as the current goes toward a higher frequency band. This also affects the characteristic impedance value of transmission line, and so on. In addition, as an alternate current flows onto a transmission line, a magnetic field is induced on the transmission line, which produces mutual inductance that affects a magnetic field of another transmission line. This mutual inductance causes magnetic energy interference that affects the inductance value of each transmission line, etc, which in turn affects the characteristic impedance value of each transmission line.

Meanwhile, coupling is a phenomenon in which alternate energies such as an electric field and a magnetic field are mutually transferred between separated spaces or transmission lines. As metals are closed to each other, this phenomenon gives rise to interference with a signal and acts as an undesired parasitic effect. This unnecessary coupling is often called "crosstalk" in view of ElectricMagnetic Interference (EMI). In the invention, therefore, unnecessary mutual interference caused by coupling is defined as crosstalk, which will be set forth below.

As noted earlier, electromagnetic interference that occurs between adjacent transmission lines is referred to as "crosstalk". This phenomenon arises due to both mutual inductance and mutual capacitance. Such mutual inductance and mutual capacitance have influence on the total inductance and the total capacitance of transmission line. The following is an explanation about the influence of mutual inductance and mutual capacitance in each mode, in an ODD mode and EVEN mode analyze in a coupled transmission line theory.

Figure 1:
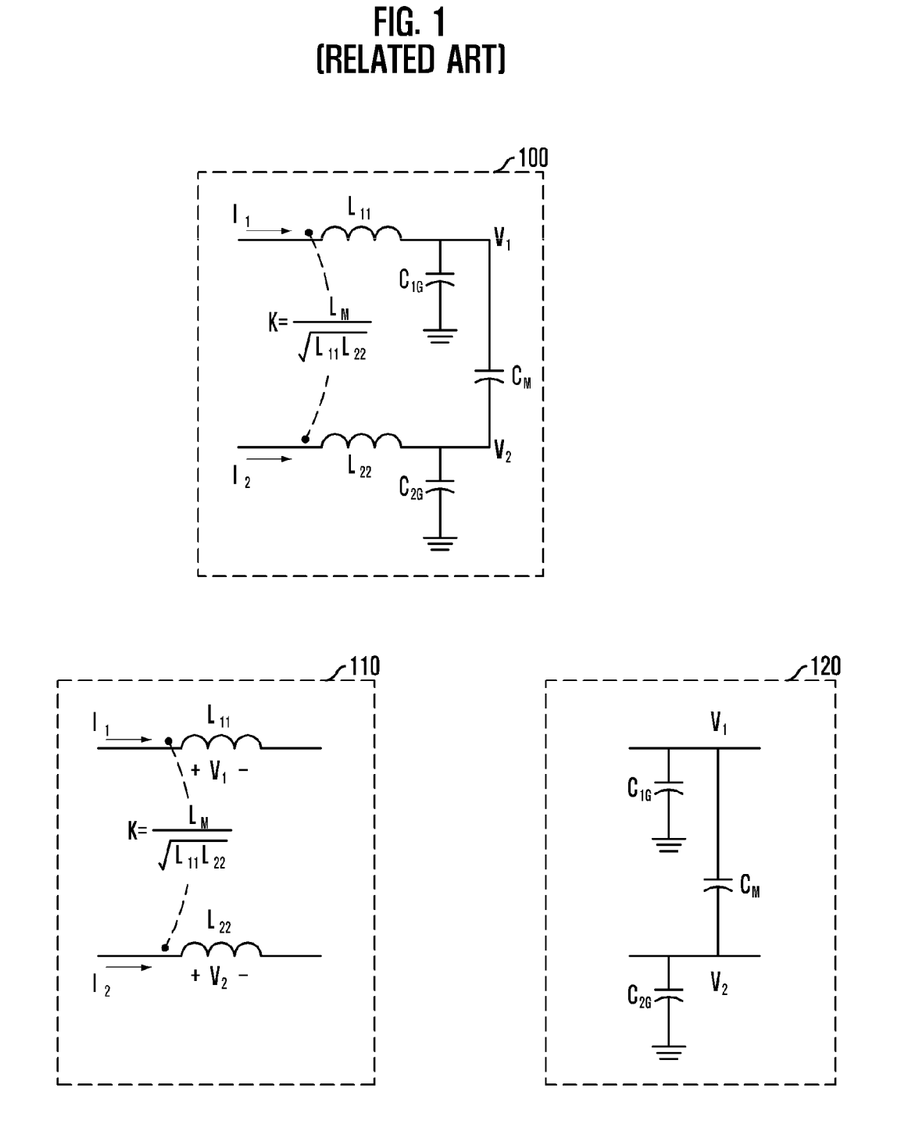
FIG. 1 is an equivalent circuit model of a coupled transmission line.

FIG. 1 shows an equivalent circuit model of a coupled transmission line, which includes an equivalent circuit 100 of inductance and capacitance, an inductance equivalent circuit 110 and a capacitance equivalent circuit 120.

Signal modes between adjacent transmission lines can be largely classified into an ODD mode and an EVEN mode. When there are two transmission lines, the ODD mode is when signals having a 180-degree phase difference, but the same amplitude, are applied to the two transmission lines, respectively. First, regarding inductance, a voltage is generated by inductive coupling and currents $I_1$ and $I_2$ flowing onto two transmission lines in the inductance equivalent circuit 110 have the same amplitude but opposite directions to each other. Assuming that the self-inductance $L_{11}=L_{22}=L_0$ and the mutual inductance $L_{12}=L_M$, $V_1$ and $V_2$ of the inductance equivalent circuit 110 may be expressed as:

$$V_1 = L_0 \frac{dI_1}{dt} + L_M \frac{dI_2}{dt} \qquad \text{Eq. (1)}$$

$$V_2 = L_0 \frac{dI_2}{dt} + L_M \frac{dI_1}{dt} \qquad \text{Eq. (2)}$$

In the ODD mode, $I_1=-I_2$ and $V_1=-V_2$, and thus, these equations may be represented as follows:

$$V_1 = L_0 \frac{dI_1}{dt} + L_M \frac{d(-I_1)}{dt} = (L_0 - L_M) \frac{dI_1}{dt} \qquad \text{Eq. (3)}$$

$$V_2 = L_0 \frac{dI_2}{dt} + L_M \frac{d(-I_2)}{dt} = (L_0 - L_M) \frac{dI_2}{dt} \qquad \text{Eq. (4)}$$

$$L_{ODD} = L_{11} - L_M \qquad \text{Eq. (5)}$$

As can be seen from Eq. (5) above, the total inductance $L_{ODD}$ in the ODD mode becomes smaller than the self-inductance $L_{11}$ by the mutual inductance $L_M$.

Similarly, relating to capacitance, assuming that in the capacitance equivalent circuit 120 the self-capacitance $C_{1G}=C_{2G}=C_0$ and the mutual capacitance $C_{12}=C_M$, $I_1$ and $I_2$ of the capacitance equivalent circuit 120 may be expressed as:

$$I_1 = C_0 \frac{dV_1}{dt} + C_M \frac{d(V_1 - V_2)}{dt} = (C_0 - C_M) \frac{dV_1}{dt} - C_M \frac{dV_2}{dt} \qquad \text{Eq. (6)}$$

$$I_2 = C_0 \frac{dV_2}{dt} + C_M \frac{d(V_2 - V_1)}{dt} = (C_0 - C_M) \frac{dV_2}{dt} - C_M \frac{dV_1}{dt} \qquad \text{Eq. (7)}$$

In the ODD mode, $I_1=-I_2$ and $V_1=-V_2$, and thus, these equations may be defined as:

$$I_1 = C_0 \frac{dV_1}{dt} + C_M \frac{d(V_1 - (-V_1))}{dt} = (C_0 + 2C_M) \frac{dV_1}{dt} \qquad \text{Eq. (8)}$$

$$I_2 = C_0 \frac{dV_2}{dt} + C_M \frac{d(V_2 - (-V_2))}{dt} = (C_0 + 2C_M) \frac{dV_2}{dt} \qquad \text{Eq. (9)}$$

$$C_{ODD} = C_{1G} + 2C_M = C_{11} + C_M \qquad \text{Eq. (10)}$$
$$C_{11} = C_{1G} + C_M$$

As can be seen from Eq. (10) above, the total capacitance $C_{ODD}$ in the ODD mode becomes greater than the self-capacitance $C_{1G}$ by $2C_M$.

Based on the total inductance $L_{ODD}$ and the total capacitance $C_{ODD}$ in Eqs. (5) and (10) above, $Z_{ODD}$ and $TD_{ODD}$ may be defined as:

$$Z_{ODD} = \sqrt{\frac{L_{ODD}}{C_{ODD}}} = \sqrt{\frac{L_{11} - L_{12}}{C_{11} + C_{12}}} \qquad \text{Eq. (11)}$$

$$TD_{ODD} = \sqrt{L_{ODD} C_{ODD}} = \sqrt{(L_{11} - L_{12})(C_{11} + C_{12})} \qquad \text{Eq. (12)}$$

Meanwhile, the EVEN mode is when signals having the same phase and the same amplitude are applied to the two transmission lines, respectively. First, as for inductance, a voltage is generated by an inductive coupling and currents $I_1$ and $I_2$ flowing onto the two transmission lines in the inductance equivalent circuit 110 have the same amplitude and the same direction. Assuming that the self-inductance $L_{11}=L_{22}=L_0$ and the mutual inductance $L_{12}=L_M$, $V_1$ and $V_2$ of the inductance equivalent circuit 110 may be expressed as in Eqs. (1) and (2) above. And, in the EVEN mode $I_1=I_2$ and $V_1=V_2$, and thus, these equations may be represented as:

$$V_1 = L_0 \frac{dI_1}{dt} + L_M \frac{d(I_1)}{dt} = (L_0 + L_M)\frac{dI_1}{dt} \quad \text{Eq. (13)}$$

$$V_2 = L_0 \frac{dI_2}{dt} + L_M \frac{d(I_2)}{dt} = (L_0 + L_M)\frac{dI_2}{dt} \quad \text{Eq. (14)}$$

$$L_{EVEN} = L_{11} + L_M \quad \text{Eq. (15)}$$

As can be seen from Eq. (15), the total inductance $L_{EVEN}$ in the EVEN mode becomes the self-inductance $L_{11}$ plus the mutual inductance $L_M$.

Similarly, assuming that in the capacitance equivalent circuit 120 the capacitance may be expressed as Eqs. (6) and (7) above, and in the EVEN mode $I_1=I_2$ and $V_1=V_2$, and thus, $I_1$ and $I_2$ may be represented again as:

$$I_1 = C_0 \frac{dV_1}{dt} + C_M \frac{d(V_1 - V_1)}{dt} = C_0 \frac{dV_1}{dt} \quad \text{Eq. (16)}$$

$$I_2 = C_0 \frac{dV_2}{dt} + C_M \frac{d(V_2 - V_2)}{dt} = C_0 \frac{dV_2}{dt} \quad \text{Eq. (17)}$$

$$C_{EVEN} = C_{1G} = C_{11} - C_M \quad \text{Eq. (18)}$$

$$C_{11} = C_{1G} + C_M$$

Accordingly, the total capacitance $C_{EVEN}$ in the EVEN mode becomes equal to the self-capacitance $C_{1G}$, as shown in Eq. (18). Using the total inductance $L_{EVEN}$ and the total capacitance $C_{EVEN}$ in Eqs. (15) and (18) above, $Z_{EVEN}$ and $TD_{EVEN}$ may be defined as:

$$Z_{EVEN} = \sqrt{\frac{L_{EVEN}}{C_{EVEN}}} = \sqrt{\frac{L_{11} + L_{12}}{C_{11} - C_{12}}} \quad \text{Eq. (19)}$$

$$TD_{EVEN} = \sqrt{L_{EVEN} C_{EVEN}} = \sqrt{(L_{11} + L_{12})(C_{11} - C_{12})} \quad \text{Eq. (20)}$$

As mentioned above, the characteristic impedance of transmission line varies depending on adjacent transmission lines and signal modes (signal transmission modes) due to the influence of coupling between the adjacent transmission lines, which gives rise to a difference in the transmission rates of signals. In result, such difference in the transmission rates acts as a factor that impairs a timing margin.

Figure 2:
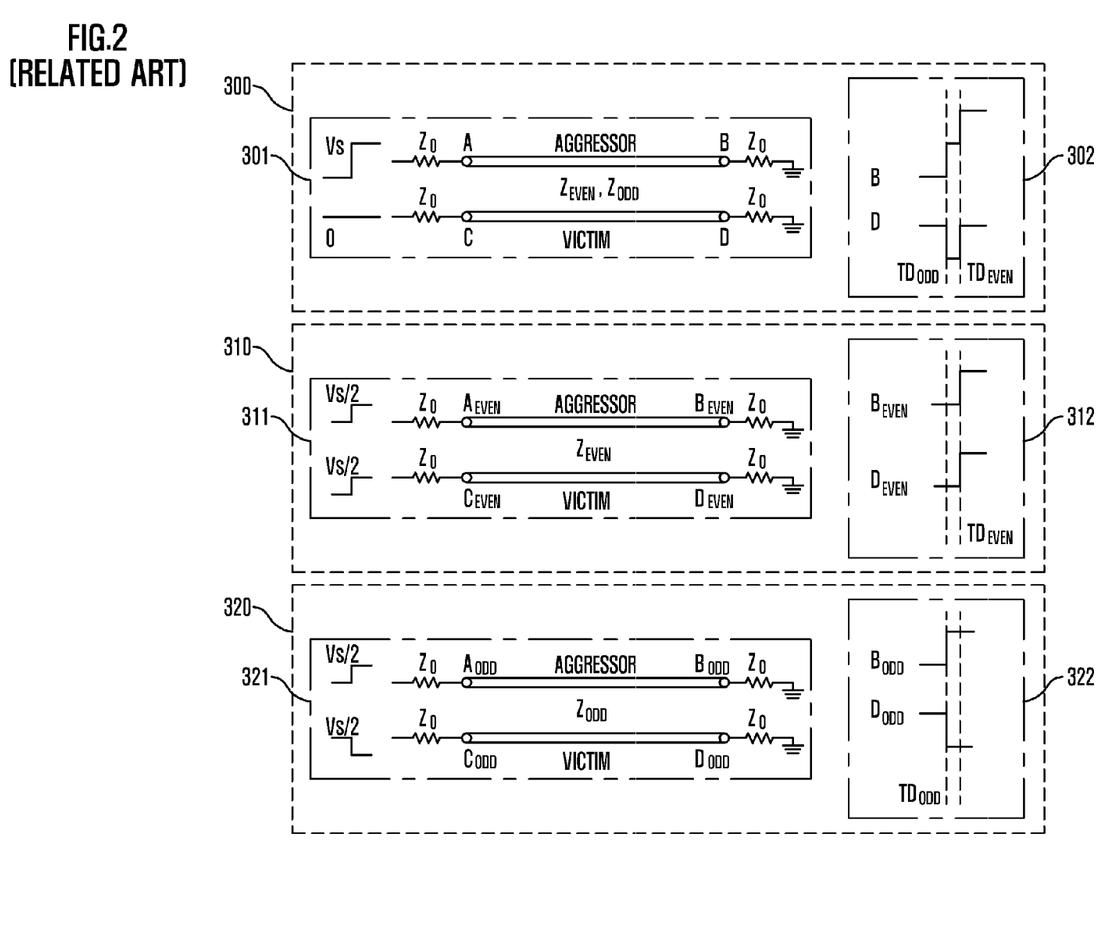
FIG. 2 is a view showing the forms of crosstalk generated depending on signal transmission modes.

FIG. 2 is a view showing several types of crosstalk generated depending on signal transmission modes.

Referring to FIG. 2, signal modes between adjacent transmission lines can be largely classified into an EVEN mode 310 and an ODD mode 320. When there are two transmission lines, the EVEN mode 310 is when signals having the same phase and the same amplitude are applied to the two transmission lines, respectively. On the other hand, the ODD mode 320 is when signals having a 180-degree phase difference but the same amplitude are applied to the two transmission lines, respectively. In addition, when there is a variation in only a signal on any one of the two transmission lines, it is regarded that the EVEN mode 310 and the ODD mode 320 overlap each other, which is called an overlap mode 300.

Now, what effect signal modes between two transmission lines would have on transmission signals on those transmission lines will be described with reference to FIG. 2.

First, referring to an EVEN mode model 311, when the EVEN mode is set between two transmission lines, it can be seen, from the signal shape 312 of the EVEN mode, the fact that the transmission rate of signal is the slowest. Further, referring to an ODD mode model 321, when the ODD mode is set between two transmission lines, it can be found, from the signal shape 322 of the ODD mode, the fact that the transmission rate of signal is the fastest. Lastly, referring to an overlap mode model 301, when the ODD mode is built up between two transmission lines, it can be found, from the signal shape 302 of the overlap mode, the fact that the signal shapes 312 and 322 of the EVEN mode and the ODD mode overlap each other.

As discussed above, there occurs a difference in the transmission rates of signals, i.e., skew, depending on signal modes between adjacent transmission lines. Among various methods developed to compensate such skew, the most frequently used method is a Delayed Locked Loop (DLL). However, this type of devices compensates such skew by synchronizing with a reference signal such as a clock, without having to consider which type of crosstalk occurred at all. Therefore, such devices require numerous control signals therein, thus making their circuits complicated and wider in area, together with much power consumption.

SUMMARY OF THE INVENTION

Embodiments of the present invention are directed to providing a semiconductor device capable of reducing skew caused by crosstalk.

In accordance with an aspect of the invention, a semiconductor device includes a plurality of transmission lines for conveying signals, a plurality of transition detectors, each checking whether a transmission signal on each of the plurality of transmission lines is transited, and if so, detecting its transition shape, a signal mode determining unit for determining signal transmission modes between adjacent transmission lines out of the plurality of transmission lines in response to output signals from the plurality of transition detectors and a plurality of delay units, each being coupled to each of the plurality of transmission lines for adjusting a transmission delay of the transmission signal depending on a corresponding output signal from the signal mode determining unit.

In accordance with another aspect of the invention, a semiconductor device includes a plurality of transmission lines for conveying signals, a plurality of transition detectors, each checking whether a transmission signal on each of the plurality of transmission lines is transited, and if so, detecting its transition shape, a signal mode determining unit for determining signal transmission modes between adjacent transmission lines out of the plurality of transmission lines in response to output signals from the plurality of transition detectors, a plurality of clock delay units, each delaying a clock signal being applied in response to a corresponding output signal from the signal mode determining unit and a plurality of latch units, each being coupled to each of the plurality of transmission lines for latching the transition signal in response to an output signal from a corresponding one of the plurality of clock delay units.

As discussed above, the prior art device employs complicated circuits such as a DLL circuit in order to remove skew caused by crosstalk. On the contrary, the invention detects the type of transition of transmission signal on each transmission line and judges a signal transmission mode between adjacent transmission lines based on the detected signal and adjusts a delay of transmission signal depending on the signal transmission mode. That is, the invention adjusts a delay difference of transmission signals based on such a delay difference by signal transmission modes, thereby removing skew.

DESCRIPTION OF SPECIFIC EMBODIMENTS

Hereinafter, preferred embodiments of the present invention will be described in detail with reference to the accompanying drawings, so that the invention can readily be practiced by those skilled in the art to which the invention pertains.

Typically, in logic circuits, a digital logic signal is identified as a logic high level or a logic low level, which is expressed as '1' or '0', respectively. In addition, it may further have a high impedance (HI-Z) state, etc., as further discussed below.

Figure 3A:
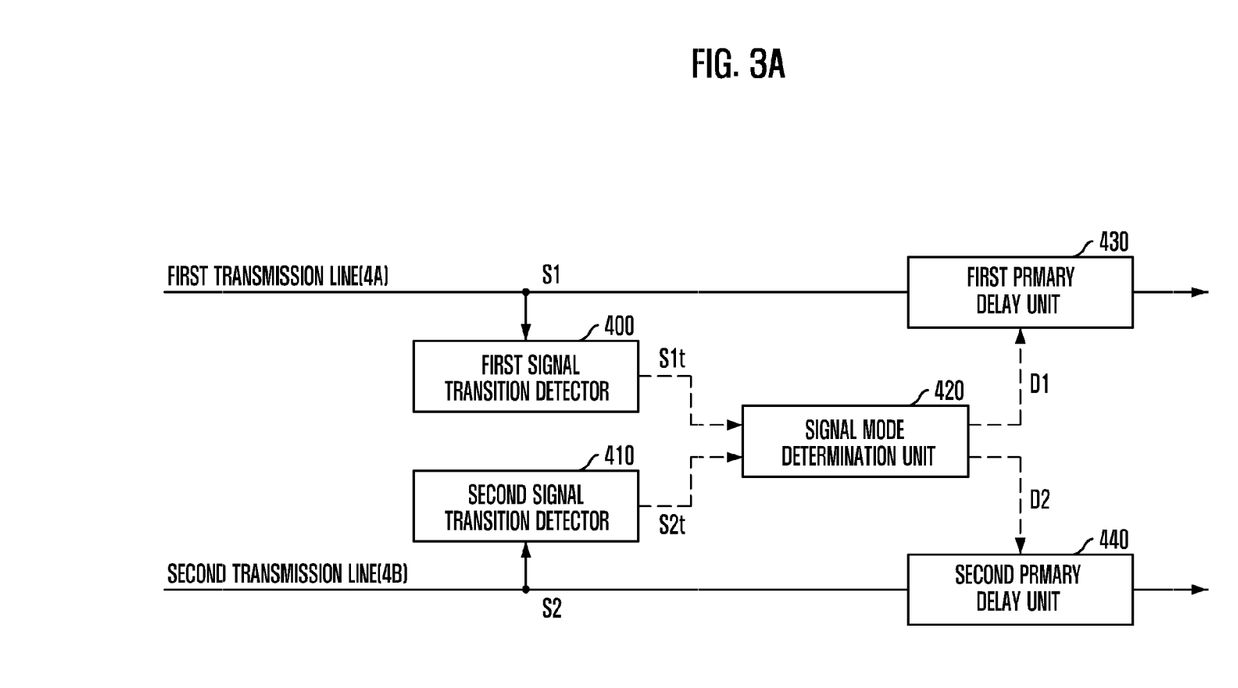
FIG. 3A is a block diagram of a semiconductor device in accordance with one embodiment of the present invention.

FIG. 3A is a block diagram showing the configuration of a semiconductor device in accordance with one embodiment of the invention. Referring to FIG. 3A, the semiconductor device of this embodiment includes a first transmission unit having first transmission line 4A, first signal transition detector 400 and first delay unit 430, and a second transmission unit includes second transmission line 4B, second signal transition detector 410 and second delay unit 440. The first and second transmission lines 4A and 4B are provided for conveying signals. The first and second signal transition detectors 400 and 410 detect transition shapes of transmission signals S1 and S2 loaded on the first and the second transmission lines 4A and 4B, respectively. A signal mode determining unit 420 determines signal transmission modes between the first and the second transmission lines 4A and 4B adjacent to each other in response to output signals S1t and S2t from the first and the second signal transition detectors 400 and 410. The first and second delay units 430 and 440 are coupled to each of the first and the second transmission lines 4A and 4B adjust transmission delays of the transmission signals S1 and S2 depending on output signals D1 and D2 from the signal mode determining unit 420, respectively.

Now, an operation of the semiconductor device having the configuration as above will be described in detail. First, each of the first and the second signal transition detectors 400 and 410 checks whether the transmission signal S1 or S2 on the first or the second transmission line is transited, and if so detects its transition shape with time, to output a check and detection result S1t or S2t. The signal mode determining unit 420 receives an output signal from each of the first and second signal transition detectors 400 and 410 and determines whether signal transmission modes established between the first and second transmission lines 4A and 4B are an EVEN mode, an ODD mode, or an overlap mode. Each of the first and the second primary delay units 430 and 440 delays each of the transmission signals S1 and S2 on each of the transmission lines depending on output signals D1 and D2 of the signal mode determining unit 420. That is, each of the first and the second delay units 430 and 440 adjusts a delay of each of the transmission signals S1 and S2 depending on the signal transmission modes between the two transmission lines 4A and 4B, thereby compensating skew caused by signal modes.

Figure 3B:
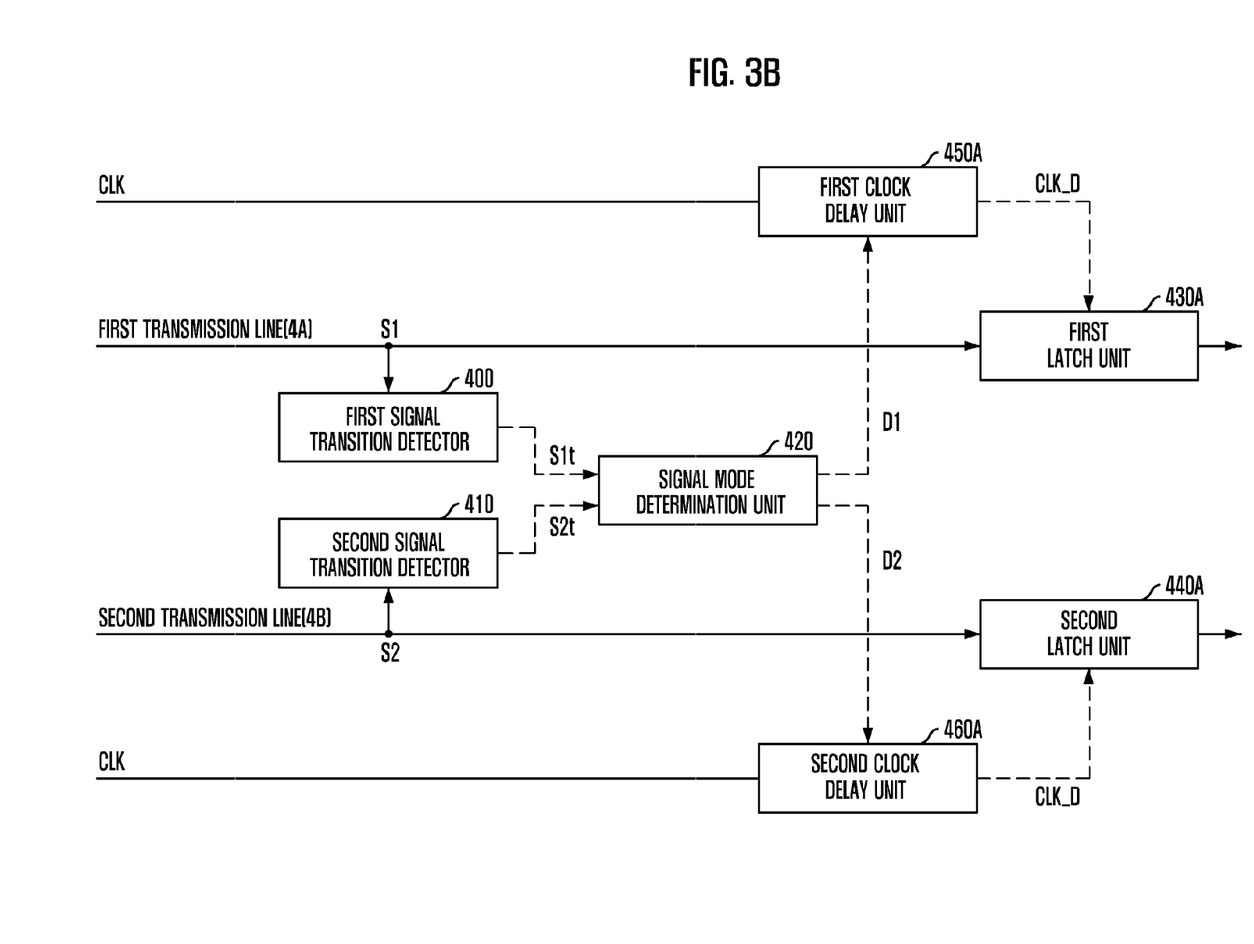
FIG. 3B is a block diagram of a semiconductor device in accordance with another embodiment of the invention.

FIG. 3B is a block diagram showing the configuration of a semiconductor device in accordance with another embodiment of the invention.

Referring to FIG. 3B, the semiconductor device of this embodiment includes a first transmission unit having a first transmission line 4A, first signal transition detector 400, first clock delay unit 450A and first latch unit 430A, and a second transmission unit having second transmission line 4B, second signal transition detector 410, second clock delay unit 460A and second latch unit 440A. The first and second transmission lines 4A and 4B for convey signals; the first and second signal transition detectors 400 and 410 detect transition shapes of transmission signals S1 and S2 on the first and the second transmission lines 4A and 4B, respectively; a signal mode determining unit 420 determine signal transmission modes between the first and the second transmission lines 4A and 4B adjacent to each other in response to output signals S1t and S2t from the first and the second signal transition detectors 400 and 410; the first and second clock delay units 450A and 460A delay clock signals CLK being applied thereto in response to output signals D1 and D2 from the signal mode determining unit 420, respectively; and first and second latches 430A and 440A coupled to each of the transmission lines latch the transmission signals in response to output signals from the clock delay units 450A and 460A, respectively.

Now, an operation of the semiconductor device having the configuration as above will be described in detail. First, each of the first and the second signal transition detectors 400 and 410 checks whether the transmission signal S1 or S2 on the first or the second transmission line is transited, and detects its transition shape with time if so, to a output check and detection result S1t or S2t, respectively. The signal mode determining unit 420 receives an output signal from each of the first and the second signal transition detectors 400 and 410 and determines whether signal transmission modes established between the first and the second transmission lines 4A and 4B are an EVEN mode, an ODD mode, or an overlap mode. Each of the first and the second clock delay units 450A and 460A delays the clock signal CLK being applied thereto in response to a corresponding one of output signals D1 and D2 from the signal mode determining unit 420 by a predetermined time period to output a delayed clock CLK_D. Each of the first and the second latches 430A and 440A coupled to each of the transmission lines latches each of the transmission signals in response to an output signal from each of the clock delay units. That is, by adjusting an input time of the clock signal CLK to control a point of time the transmission signal on each of the transmission lines is to be latched, skew generated by signal modes can be compensated. Although the single clock signal CLK has been used by way of example, plural clocks may be used where necessary.

Figure 4:
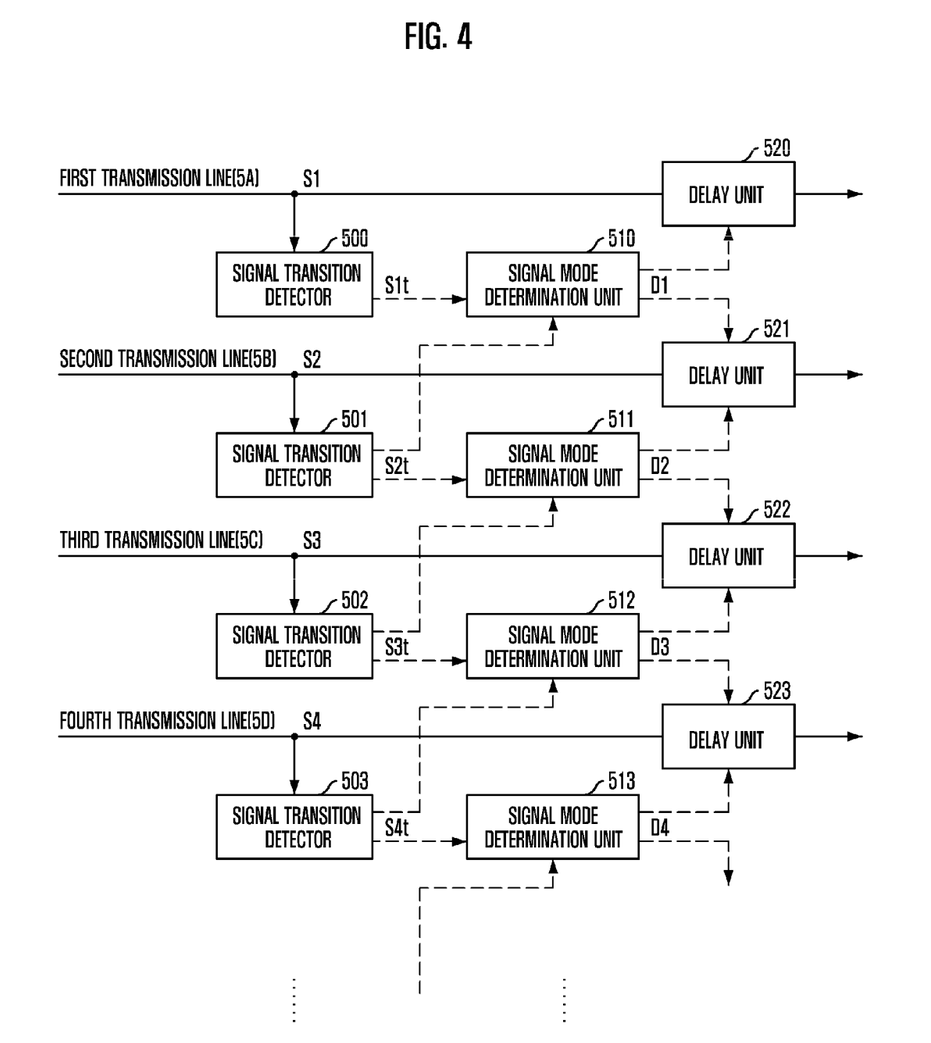
FIG. 4 is a block diagram of a semiconductor device in accordance with still another embodiment of the invention.

FIG. 4 is a block diagram showing the configuration of a semiconductor device in accordance with still another embodiment of the invention. Referring to FIG. 4, the semiconductor device of this embodiment includes transmission lines 5A, 5B, 5C, and 5D for conveying signals; signal transition detectors 500 to 503 for detecting transition shapes of transmission signals S1, S2, S3, and S4 on the transmission lines 5A, 5B, 5C, and 5D, respectively; signal mode determining units 510 to 513 for determining signal transmission modes between the adjacent transmission lines in response to output signals S1$t$, S2$t$, S3$t$, and S4$t$ from the signal transition detectors 500 to 503, respectively; and delay units 520 to 523 coupled to each of the transmission lines for adjusting transmission delays of the transmission signals S1, S2, S3, and S4 depending on output signals D1, D2, D3, and D4 from their respective adjacent mode determining units, respectively.

An operation of the semiconductor device configured as above is substantially identical to that of the embodiment in FIG. 3A. However, in contrast to the embodiment of FIG. 3A, here the invention is applied to adjacent transmission lines out of plural transmission lines arranged in the semiconductor device. Such an operation of the embodiment of FIG. 4 will be described below.

First, each of the signal transition detectors 500 to 503 checks whether the transmission signal S1, S2, S3, or S4 on its corresponding transmission line is transited, and detects its transition shape with time if so, to an output check and detection result S1$t$, S2$t$, S3$t$, or S4$t$. Each of the signal mode determining units 510 to 513 determines a signal transmission mode between the adjacent transmission lines in response to an output signal S1$t$, S2$t$, S3$t$, or S4$t$ from each of the signal transition detectors 500 to 503. Each of the delay units 520 to 523 delays a transmission delay of the transmission signal S1, S2, S3, or S4 in response to an output signal D1, D2, D3, or D4 from each of the plural signal mode determining units 420. That is, each of the delay units 520 to 523 adjusts a delay of the transmission signal S1, S2, S3, or S4 depending on signal transmission modes between adjacent transmission lines out of the signal transmission lines 5A, 5B, 5C, and 5D, thereby compensating skew generated by signal modes.

Figure 5:
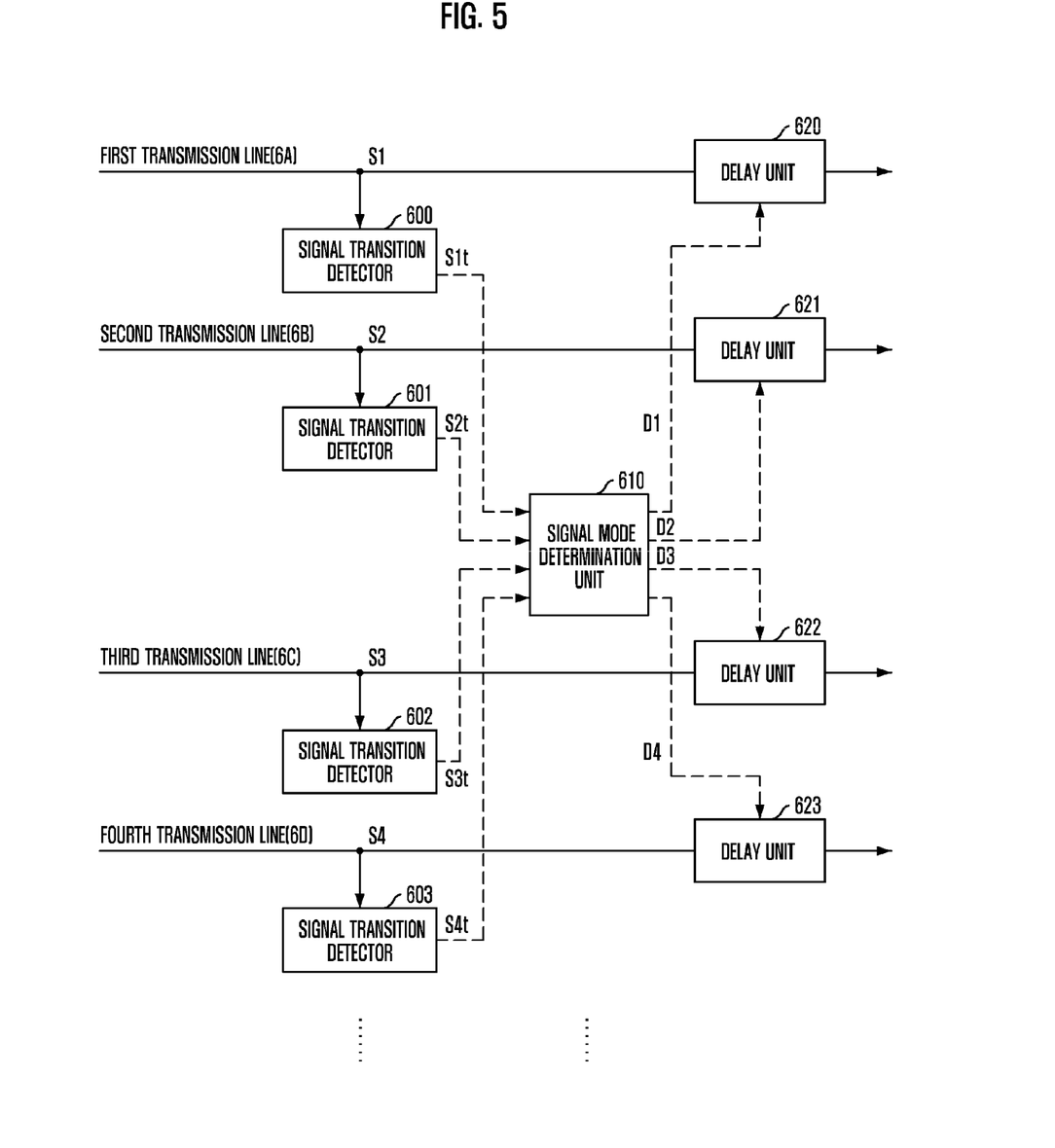
FIG. 5 is a block diagram of a semiconductor device in accordance with a further embodiment of the invention.

FIG. 5 is a block diagram showing the configuration of a semiconductor device in accordance with still another embodiment of the invention. Referring to FIG. 5, the semiconductor device of this embodiment includes transmission lines 6A, 6B, 6C, and 6D for conveying signals; signal transition detectors 600 to 603 for detecting transition shapes of signals S1, S2, S3, and S4 on the transmission lines 5A, 5B, 5C, and 5D, respectively; a signal mode determining unit 610 for determining signal transmission modes between the adjacent transmission lines in response to output signals S1$t$, S2$t$, S3$t$, and S4$t$ from the signal transition detectors 600 to 603; and delay units 620 to 623 coupled to each of the transmission lines for adjusting transmission delays of the signals S1, S2, S3, and S4 depending on output signals D1, D2, D3, and D4 from the signal mode determining unit 610, respectively.

Now, an operation of the semiconductor device as configured above will be described below.

First, each of the signal transition detectors 600 to 603 checks whether the transmission signal S1, S2, S3, or S4 on its corresponding transmission line is transited, and detects its transition shape with time if so, to output a check and detection result S1$t$, S2$t$, S3$t$, or S4$t$. The signal mode determining unit 610 determines signal transmission modes between adjacent transmission lines in response to an output signal S1$t$, S2$t$, S3$t$, or S4$t$ from each of the signal transition detectors 600 to 603. Each of the delay units 620 to 623 adjusts a transmission delay of the transmission signal S1, S2, S3, or S4 in response to an output signal D1, D2, D3, or D4 from the signal mode determining unit 620. That is, each of the delay units 520 to 523 adjusts a delay of the transmission signal S1, S2, S3, or S4 by taking account of all signal transmission modes between adjacent transmission lines together out of the signal transmission lines 5A, 5B, 5C, and 5D, thereby compensating skew generated by signal modes. This embodiment adjusts a transmission delay of each transmission signal by determining all signal modes between adjacent transmission lines together, differently from determining only individual signal transmission modes between adjacent transmission lines in the embodiment in FIG. 3A.

In the embodiments illustrated in FIGS. 3A to 5, the semiconductor device may include plural auxiliary delay units which are connected to each transmission line before the delay unit or latch unit to delay transmission signals for a predetermined time period. That is to say, a delay control signal or a delayed clock signal may not reach at a desired point of time if there is a large operation delay time in the signal transition detector and the signal mode determining unit. In order to remove this problem, the auxiliary delay units may delay the transmission signals to some degrees in advance.

Figure 6:
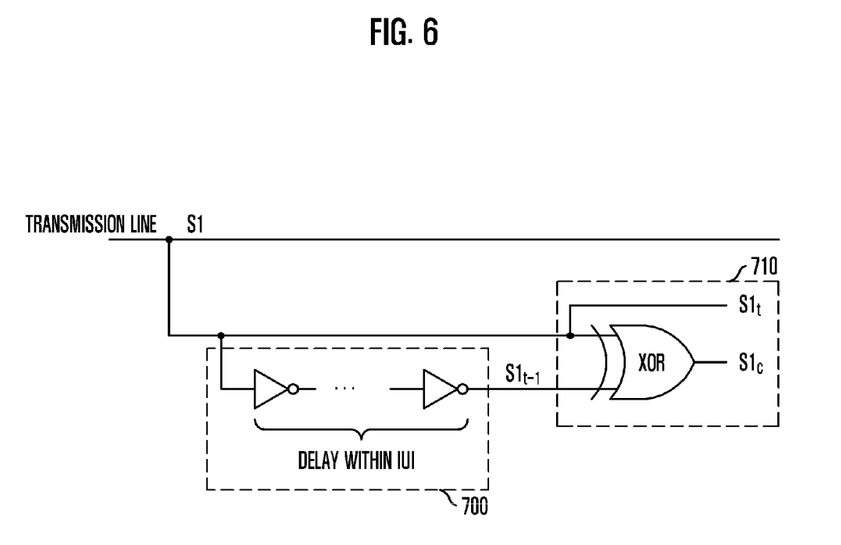
FIG. 6 is circuit diagram illustrating an example of the signal transition detector in accordance with the invention.

FIG. 6 is circuit diagram illustrating an example of the signal transition detector in accordance with the invention.

Referring to FIG. 6, the signal transition detector includes a delay element 700 for delaying a first transmission signal S1 on a transmission line, and a signal comparator 710 for comparing an output signal S1$_{t-1}$ from the delay element 700 with a second transmission signal S1$_t$ on the transmission line. The signal comparator 710 is composed of an exclusive OR gate XOR for comparing the two signals.

An operation of the signal transition detector having the configuration as above will now be described in detail.

First, the delay element 700 delays the first transmission signal S1 applied thereto within a 1 Unit Interval (1UI) to output a delayed signal S1$_{t-1}$. Then, the signal comparator 710 compares the delayed signal S1$_{t-1}$ with a second transmission signal S1$_t$ on the transmission line through their exclusive OR operation to generate an output signal S1$_c$. Thus, it is possible to check whether or not the signal on the transmission line is transited based on the output signal S1$_t$ from the signal comparator 710. That is, if the transmission signal S1 is transited based on comparison between the delayed signal S1$_{t-1}$ and the second transmission signal S1$_t$, the signal comparator 710 outputs a first logic signal '1', and otherwise, it outputs a second logic signal '0'.

Also, it is possible to check the transition shape of the transmission signal S1 by using the output signal S1$_c$ from the comparator 710 and the second transmission signal S1$_t$. For example, if the output signal S1$_c$ from the comparator 710 is '1' and the second transmission signal S1$_t$ is '1', then the transmission signal S1 is transited from '0' to '1', while if the output signal S1$_c$ from the comparator 710 is '1' and the second transmission signal S1$_t$ is '0', then the transmission signal S1 is transited from '1' to '0'. As described above, it is possible to check whether the transmission signal S1 is transited and to detect its transition shape if so based on the output signal $S1_c$ from the comparator 710 and the second transmission signal $S1_t$. In other words, based on comparison between a signal, which is obtained by delaying a transmission signal by a predetermined time, and a signal on a current transmission line, a transition shape of that signal can be determined.

Differently from the above-stated embodiments, if a transmission signal has a preamble set, that is, if a circuit starts to operate after the transmission signal is set to a logic low level or a logic high level in advance, it is possible to check whether the transmission signal is transited and to detect its transition shape if so, only by sensing a level of that signal. In other words, in a system where a preamble is defined by a logic low level, if a signal being transmitted at is at a logic high level, this means that the transmission signal is transited from a logic low level to a logic high level at that time.

Figure 7:
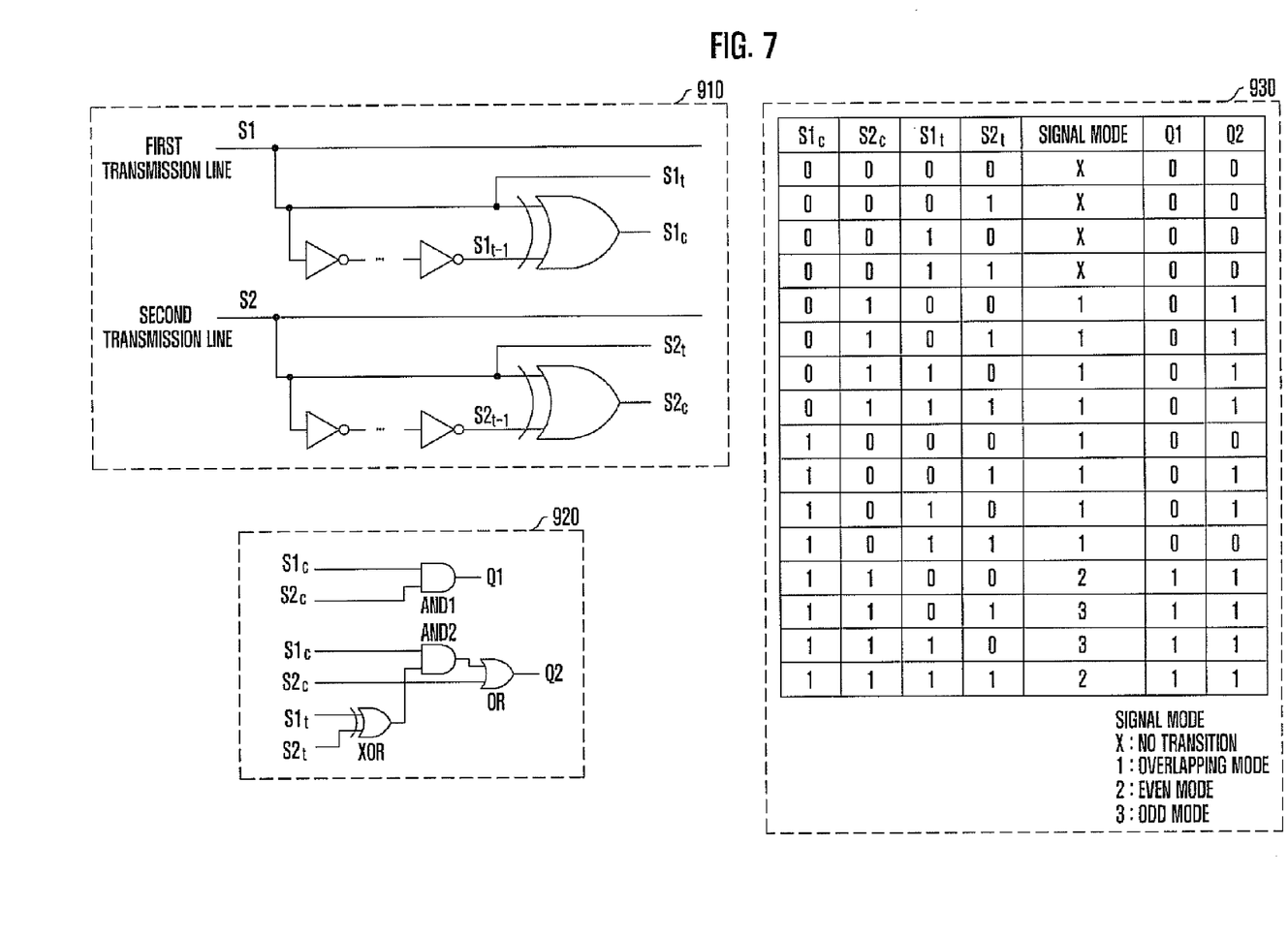
FIG. 7 is a circuit diagram illustrating another example of the signal mode determining unit in accordance with the invention.

FIG. 7 is a circuit diagram illustrating another example of the signal mode determining unit in accordance with the invention. In particular, FIG. 7 shows a circuit diagram of the signal mode determining unit 920 and also determination results in a table 930, when the signal transition detector 910 checks whether transmission signals S1 and S2 on first and second transmission lines are transited and detects their transition shapes if so.

Referring to FIG. 7, the signal mode determining unit 920 determines signal modes between the first and the second transmission modes based on first to fourth output signals $S1_c$, $S2_c$, $S1_t$, and $S2_t$ provided from the signal transition detector 910. To this end, the signal mode determining unit 920 is provided with a first AND gate AND1 for performing an AND operation on the first and the second output signals $S1_c$ and $S2_c$, an exclusive OR gate XOR for performing an exclusive OR operation on the third and the fourth output signals $S1_t$ and $S2_t$, a second AND gate AND2 for performing an AND operation on an output signal from the exclusive OR gate XOR and the first output signal $S1_c$, and an OR gate OR for performing an OR operation on an output signal from the second AND gate AND2 and the second output signal $S2_c$. Therefore, signal modes between the two transmission lines can be determined based on a first mode signal Q1 from the first AND gate AND1 and a second mode signal Q2 from the OR gate OR, wherein its results are shown in table 930.

Figure 8:
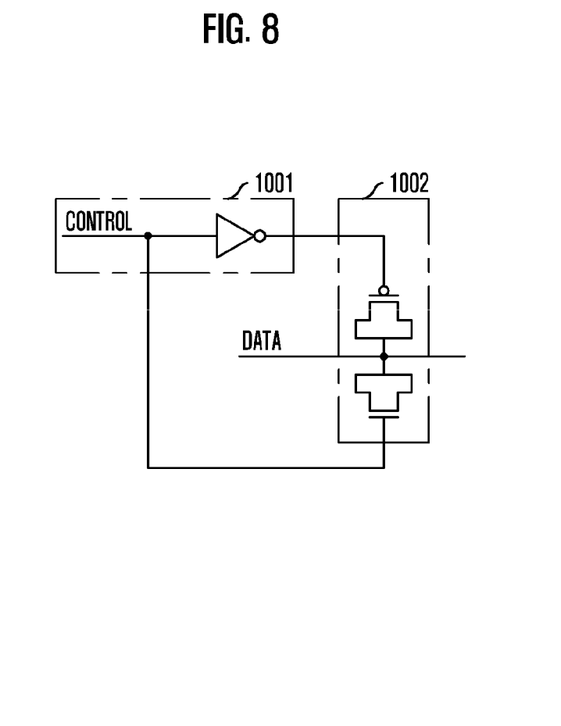
FIG. 8 is a circuit diagram illustrating an example of the delay unit in accordance with the invention.

FIG. 8 is a circuit diagram illustrating an example of the delay element in accordance with the invention. Referring to FIG. 8, the delay element is provided with a control signal generator 1001 for receiving an output signal CONTROL from the signal mode determining unit, and first and second MOS capacitors 1002 coupled to a transmission line having a transmission signal loaded for responding to an output signal from the control signal generator 1001. In this configuration, the delay element can be used only for configuring a circuit for delaying an ODD mode signal, and outputs a signal to activate the MOS capacitors 1002 from the control signal generator 1001 when the output signal CONTROL from the signal mode determining unit denotes an ODD mode, thereby delaying the transmission signal DATA.

Figure 9:
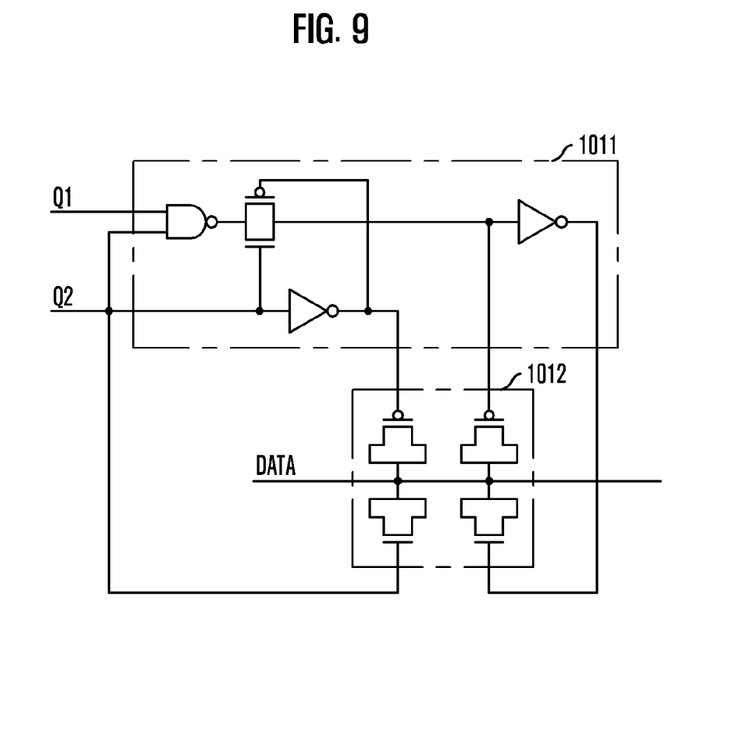
FIG. 9 is a circuit diagram illustrating another example of the delay unit in accordance with the invention.

FIG. 9 is a circuit diagram illustrating another example of the delay element in accordance with the invention. Referring to FIG. 9, the delay element is provided with a control signal generator 1011 for taking first and second output signals Q1 and Q2 from the signal mode determining unit, and first to fourth MOS capacitors 1012 coupled to a transmission line having a transmission signal loaded for responding to an output signal from the control signal generator 1011. In this configuration, the delay element can be used for configuring a circuit for adjusting the degree of delay depending on each signal mode. How to determine operation modes based on the first and second output signals Q1 and Q2 from the signal mode determining unit will be described below.

First, if (Q1,Q2) is (0,0) and (Q1,Q2) is (1,0), a MOS capacitor is not activated, if (Q1,Q2) is (0,1), then a pair of MOS capacitors are activated, and if (Q1,Q2) is (1,1), two pair of MOS capacitors are activated. Therefore, the transmission delay of the transmission signal DATA can be adjusted depending on each signal mode.

In the above-described configuration, it should be noted that the number of transmission lines employed in the signal mode determining unit may be changed in various manner. For example, there may be only adjacent transmission lines, or transmission lines within any range set by considering the intensity of the influence of crosstalk occurring between adjacent transmission lines where necessary. In addition, while the delay element in the embodiments of the invention used a general RC delay with MOS capacitors, there may be a variety of methods to delay signals. For example, any of those methods may be properly selected depending on area or power consumption conditions. Since examples of circuit changes or modifications are obvious to those skilled in the art, details thereof will be omitted here.

As a result, the invention is more specialized and suitable for removing skew caused by crosstalk because it takes account of directly the reasons why skew is generated, differently from an existing skew compensating circuit such as a Delay Locked Loop (DLL). Thus, the invention is very advantageous in circuit area, power consumption, and so on.

In addition, the invention can improve the performance of a semiconductor device due to an increase in a timing margin by removal of skew, and also can integrate more transmission lines.

While the invention has been described with respect to the specific embodiments, it will be apparent to those skilled in the art that various changes and modifications may be made without departing from the spirit and scope of the invention as defined in the following claims.

What is claimed is:

1. A semiconductor device, comprising a plurality of transmission units, each including a transmission line to convey a signal, a transition detector to check whether a transmission signal on the transmission line is transited, and if so detect its transition shape, and a primary delay unit coupled to the transmission line to adjust a transmission delay of the transmission signal, the transmission lines of the transmission units being successively adjacent to each other; and respective signal mode determining units to determine signal transmission modes between pairs of adjacent transmission lines among the transmission lines of the plurality of transmission units, in response to output signals of the transition detectors, the primary delay units of the transmission units adjusting transmission delays of the transmission signals conveyed by the respective transmission lines depending on corresponding output signals of the signal mode determining units wherein each of the primary delay units includes a control signal generator for generating a delay control signal in response to a corresponding output signal from a respective one of the signal mode determining units, and a plurality of MOS capacitors, coupled to each of the plurality of transmission lines and being under the control of the corresponding delay control signal.

2. The semiconductor device as recited in claim 1, further comprising a plurality of auxiliary delay units, respectively coupled to each of the transmission lines before the primary delay units for delaying the transmission signals.

3. A semiconductor device, comprising:

a plurality of transmission units, each including a transmission line for conveying signals, a transition detector to check whether a transmission signal on the respective transmission line is transited, and if so detect its transition shape, a clock delay unit to adjust a transmission delay of a clock signal, and a latch unit to latch the transition signal in response to an output signal of the clock delay unit, the transmission lines of the transmission units being successively adjacent to each other;

respective signal mode determining units to determine signal transmission modes between pairs of adjacent transmission lines among the transmission lines of the plurality of transmission units in response to output signals of the transition detectors; and the clock delay units of the transmission units each delaying a clock signal being applied in response to a corresponding output signal from the corresponding signal mode determining unit.

4. The semiconductor device as recited in claim 3, further comprising a plurality of auxiliary delay units, each being coupled to each of the plurality of transmission lines before the plurality of latch units for delaying the transmission signal.

5. The semiconductor device as recited in claim 3, wherein each of the plurality of transition detectors includes a delay element for delaying a first transmission signal on a corresponding one of the plurality of transmission lines, and a signal comparator for comparing an output signal from the delay element with a second transmission signal on the corresponding one of the plurality of transmission lines.

6. The semiconductor device as recited in claim 5, wherein the second transmission signal is loaded on the corresponding one of the plurality of transmission lines at a rate slower than the first transmission signal.

7. The semiconductor device as recited in claim 6, wherein the signal comparator includes an exclusive OR gate for performing an exclusive OR operation on the second transmission signals and the output signal from the delay element.

8. The semiconductor device as recited in claim 6, wherein each of the signal mode determining units includes a first AND gate for performing an AND operation on a first output signal corresponding to an output signal from the signal comparator in a first transition detector coupled to a first transmission line out of the plurality of transmission lines and a second output signal corresponding to an output signal from the signal comparator in a second transition detector coupled to a second transmission line;

an exclusive OR gate for performing an exclusive OR operation on a third output signal corresponding to the second transmission signal from the first transition detector and a fourth output signal corresponding to the second transmission signal from the second transition detector;

a second AND gate for performing an AND operation on the first output signal and an output signal from the exclusive OR gate; and an OR gate for performing an OR operation on the second output signal and an output signal from the exclusive OR gate, the first AND gate outputting a first mode signal and the OR gate outputs a second mode signal.

* * * * *